(12) United States Patent
Izumi

(10) Patent No.: US 8,796,856 B2
(45) Date of Patent: Aug. 5, 2014

(54) SEMICONDUCTOR DEVICE AND MANUFACTURING METHOD THEREOF

(75) Inventor: Takashi Izumi, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 552 days.

(21) Appl. No.: 12/588,989

(22) Filed: Nov. 4, 2009

(65) Prior Publication Data

US 2010/0109114 A1   May 6, 2010

(30) Foreign Application Priority Data

Nov. 5, 2008   (JP) ................................. 2008-284290

(51) Int. Cl.
*H01L 23/48* (2006.01)
*H01L 27/146* (2006.01)
*H01L 21/768* (2006.01)
*H01L 21/74* (2006.01)
*H01L 23/31* (2006.01)

(52) U.S. Cl.
CPC . *H01L 21/76898* (2013.01); *H01L 2224/02372* (2013.01); *H01L 2224/05548* (2013.01); *H01L 23/3114* (2013.01); *H01L 27/14632* (2013.01); *H01L 2224/13021* (2013.01); *H01L 2224/16146* (2013.01); *H01L 2924/0002* (2013.01); *H01L 21/743* (2013.01); *H01L 2224/13024* (2013.01); *H01L 23/481* (2013.01); *H01L 2224/13* (2013.01); *H01L 27/14618* (2013.01); *H01L 2224/05* (2013.01)
USPC .... 257/773; 257/434; 257/690; 257/E31.111; 257/E23.011

(58) Field of Classification Search
USPC ........... 257/434, 690, E31.111, E23.011, 773
See application file for complete search history.

(56) References Cited

U.S. PATENT DOCUMENTS

| 6,653,221 B1 * | 11/2003 | Subramanian et al. ........ 438/620 |
| 7,919,348 B2 * | 4/2011 | Akram et al. .................... 438/64 |
| 2010/0019387 A1 * | 1/2010 | Miura ............................ 257/773 |

FOREIGN PATENT DOCUMENTS

| JP | 07-335811 A | 12/1995 |
| JP | 11-354631 A | 12/1999 |
| JP | 2003-197855 A | 7/2003 |
| JP | 2007-012896 | * 1/2007 ............. H01L 23/14 |
| JP | 2007-012896 A | 1/2007 |
| JP | 2007-305804 A | 11/2007 |

OTHER PUBLICATIONS

Japanese Office Action issued on Jun. 7, 2012, with an English language translation.

* cited by examiner

*Primary Examiner* — Zandra Smith
*Assistant Examiner* — Jamie C Niesz
(74) *Attorney, Agent, or Firm* — Rabin & Berdo, P.C.

(57) ABSTRACT

A semiconductor device manufacturing method is disclosed. The method includes etching a silicon on insulator (SOI) from its surface (i.e., semiconductor substrate layer) to form a first trench and a second trench. The first trench extends through the SOI substrate and reaches an electrode pad. The second trench terminates in the semiconductor substrate layer. The manufacturing method also includes forming an insulation film that covers the surface of the semiconductor substrate layer as well as the side walls and bottoms of the first and second trenches. The manufacturing method also includes removing the insulation film from the bottoms of the first and second trenches to expose the electrode pad from the first trench bottom and to expose the semiconductor substrate layer from the second trench bottom.

11 Claims, 11 Drawing Sheets

43a,43g  50  30

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and, more particularly, to a semiconductor device including a silicon on insulator (SOI) device.

2. Description of the Related Art

An SOI device has a silicon substrate layer and a thin film silicon layer (hereinafter, referred to as an SOI layer) provided on the silicon substrate layer. The silicon substrate layer is separated from the thin film silicon layer by a buried oxide film layer (hereinafter, referred to as a BOX layer) in an insulated state. Consequently, it is possible to easily achieve insulative separation between neighboring elements. In addition, no parasitic thyristor is formed via the silicon substrate layer, with the result that it is possible to prevent the occurrence of a latch up phenomenon. When a transistor is mounted in the SOI layer on the BOX layer, it is possible to effectively restrain the occurrence of a so-called short channel effect. The short channel effect is a phenomenon in which power consumption increases with the downsizing of the transistor. Since the junction capacity of a transistor having an SOI structure is less than that of a transistor having a bulk structure, high-speed operation is possible in the SOI device. The transistor having the SOI structure is expected to exhibit many excellent properties and achieve higher speed and lower power consumption than a semiconductor element formed on a conventional bulk substrate. Attempts are being conducted to apply a wafer having the SOI structure (hereinafter, referred to as an SOI substrate) to an optical sensor, such as an ultraviolet (UV) sensor and an image sensor.

An optical sensor, such as a UV sensor and an image sensor, is mounted in a mobile device, such as a mobile phone. For this reason, the further reduction of a package size is needed. Therefore, a wafer level chip size package (W-CSP) having a through via is used as a package of such optical sensor. Since it is possible to form an external terminal at a back face (lower face), i.e., the surface opposite a light receiving surface, of the W-CSP having the through via, the external terminal can be arranged at a desired position without being affected by the light receiving area. This satisfies the demand for reduction of the package size.

When the W-CSP having the through via is applied to the SOI device, however, the following problems are caused. If the W-CSP is applied to the SOI device, the silicon substrate layer below the BOX layer is not connected to any external terminal, and the potential of the silicon substrate layer floats. When the potential of the silicon substrate layer is in a floating state, the operation of a circuit formed at the SOI layer may become unstable, with the result that the circuit may malfunction. Therefore, it is necessary to fix the potential of the silicon substrate layer by a suitable method.

An example of the method of fixing the potential of the silicon substrate layer of the SOI substrate is disclosed in Japanese Patent Application Kokai (Laid-Open) No. 7-335811. This fixing method relies upon a chip that is loaded on a lead frame fixed at ground potential via a conductive adhesive.

Japanese Patent Application Kokai No. 11-354631 discloses a semiconductor device having a conductive layer. The conductive layer extends through the SOI layer and the BOX layer from the upper surface of the SOI layer, and connects to the silicon substrate layer. A substrate potential fixing electrode is formed at the surface of the SOI layer. The substrate potential fixing electrode is electrically connected to the conductive layer.

SUMMARY OF THE INVENTION

In the W-CSP having the through via, the semiconductor device is generally mounted to a mounting substrate with a solder ball. The solder ball serves as the external terminal. Thus, it is difficult to perform a loading method of directly connecting the lower surface of the SOI substrate to the lead frame. In other words, it is not possible to apply the construction disclosed in Japanese Patent Application Kokai No. 7-335811 to the W-CSP having the through via.

Because the substrate potential fixing electrode is formed at the upper (front) surface of the SOI layer, it is not possible to apply the construction disclosed in Japanese Patent Application Kokai No. 11-354631 to a package having the external terminal at the lower (back) surface of the SOI substrate without modification. That is, when the structure disclosed in Japanese Patent Application Kokai No. 11-354631 is applied to the W-CSP having the through via, it is necessary to provide a voltage application path different from the through via so as to apply potential to the substrate potential fixing electrode formed at the upper (front) surface of the chip. For example, it is necessary to perform wire bonding. As a result, merits obtained through the adoption of the through via structure are reduced. Furthermore, it is necessary to form a contact, such that the contact reaches the silicon substrate layer, by etching the SOI substrate from the upper face side thereof. As a result, the number of manufacturing steps of the wafer manufacturing process is increased. Also, it is necessary to secure an additional space necessary to form the contact, with the result that the chip size may be increased.

One object of the present invention is to provide a W-CSP type semiconductor device including an SOI device with a through via. This semiconductor device is capable of fixing potential of a silicon substrate layer of an SOI substrate without increasing a package size or changing a package manufacturing process and a wafer manufacturing process.

Another object of the present invention is to provide a W-CSP semiconductor device manufacturing method that can fix potential of a silicon substrate layer of an SOI substrate without increasing a package size or changing a package manufacturing process and a wafer manufacturing process.

Accordance to a first aspect of the present invention, there is provided a manufacturing method of a semiconductor device. The resulting semiconductor device includes an SOI substrate. The SOI substrate has a semiconductor substrate layer and a semiconductor layer, with an insulation film provided between the semiconductor substrate layer and the semiconductor layer. The semiconductor layer has a semiconductor element and an electrode pad formed on a surface thereof. The semiconductor device also includes a through via extending through the SOI substrate. The through via is electrically connected to the electrode pad. The semiconductor device also includes one or more external terminals provided on the semiconductor substrate layer. A second insulation film extends between the external terminals and semiconductor substrate layer. The external terminals are electrically connected to the through via. The manufacturing method includes etching the SOI substrate from the semiconductor substrate layer to form a first trench such that the first trench extends through the SOI substrate and reaches the electrode pad and to form a second trench such that the second trench terminates in the semiconductor substrate layer. The manufacturing method also includes forming an insulation film such that the insulation film covers the surface of the semiconductor substrate layer and side walls and bottoms of the first and second trenches. The manufacturing method also includes removing the insulation film from the bottoms of the first and second trenches to expose the electrode pad from the bottom of the first trench and to expose the semiconductor substrate layer from the bottom of the second trench. This insulation film is the second insulation film. The manufacturing method also includes forming a conductive film such that the conductive film covers the surface of the semiconductor substrate layer and the side walls and the bottoms of the first and second trenches to form the through via electrically connected to the electrode pad at the bottom of the first trench and to form a contact part electrically connected to the semiconductor substrate layer at the bottom of the second trench. The manufacturing method also includes patterning the conductive film on the semiconductor substrate layer to form the external electrodes and to form a potential fixing external electrode electrically connected to the contact part. The semiconductor device is, for example, an image sensor.

The manufacturing method is particularly useful to the semiconductor device that includes the SOI part and has a W-CSP structure with a through via. The manufacturing method of the present invention can construct the potential fixing terminal of the silicon substrate layer of the SOI substrate without increasing the package size and adding manufacturing steps. The potential fixing external terminal for applying fixed potential to the silicon substrate layer may be the same structure as (or a similar structure to) the ordinary external terminals and is provided on the same surface as the ordinary external terminals. Alternatively, an existing external terminal (for example, the GND terminal) may be used as the potential fixing external terminal. Therefore, the package size is not increased due to the provision of the potential fixing external terminal. Further, the process of forming the back contact connected to the silicon substrate layer or the potential fixing external terminal may be included in the existing W-CSP process. Thus, the number of manufacturing steps is not increased, and processing time is not increased.

According to a second aspect of the present invention, there is provided a semiconductor device including an SOI substrate. The SOI substrate has a semiconductor substrate layer and a semiconductor layer. The semiconductor layer has a semiconductor element and an electrode pad formed thereon. An insulation film is disposed between the semiconductor substrate layer and the semiconductor layer. The semiconductor device also includes a through via extending through the SOI substrate from a surface of the semiconductor substrate layer. The through via is electrically connected to the electrode pad. The semiconductor device also includes one or more external terminals provided on the semiconductor substrate layer. A second insulation film is disposed between the external terminals and the semiconductor substrate layer. The external terminals are electrically connected to the through via. The semiconductor device further includes a contact part having a conductive film. The conductive film is electrically connected to the semiconductor substrate layer at a bottom of a trench. The trench has an opening at the surface of the semiconductor substrate layer. The trench terminates in the semiconductor substrate layer. The semiconductor device also includes a potential fixing electrode provided on the semiconductor substrate layer. The second insulation film extends between the potential fixing electrode and the semiconductor substrate layer. The potential fixing electrode is electrically connected to the contact part. The semiconductor device is, for example, an image sensor.

The present invention may be directed to a manufacturing method of a semiconductor device, said semiconductor device including:

a silicon on insulator (SOI) substrate having a semiconductor substrate layer, a semiconductor layer and a first insulation film, said semiconductor layer having a semiconductor element and an electrode pad thereon, and said first insulation film being disposed between the semiconductor substrate layer and the semiconductor layer;

a through via extending through the SOI substrate, the through via being electrically connected to the electrode pad;

an external terminal provided on a surface of the semiconductor substrate layer, the external terminal being electrically connected to the through via; and a second insulation film being disposed between the external terminal and the semiconductor substrate layer;

the manufacturing method comprising:

etching the SOI substrate from the semiconductor substrate layer to form a first trench that extends through the SOI substrate and reaches the electrode pad and to form a second trench that terminates in the semiconductor substrate layer;

forming the second insulation film such that the second insulation film covers the surface of the semiconductor substrate layer and side walls and bottoms of the first and second trenches;

removing the insulation film from the bottoms of the first and second trenches to expose the electrode pad from the bottom of the first trench and to expose the semiconductor substrate layer from the bottom of the second trench;

forming a conductive film such that the conductive film covers the surface of the semiconductor substrate layer and the side walls and the bottoms of the first and second trenches to form the through via electrically connected to the electrode pad at the bottom of the first trench and to form a contact part electrically connected to the semiconductor substrate layer at the bottom of the second trench; and patterning the conductive film on the surface of the semiconductor substrate layer to form the external electrode and to form a potential fixing external electrode electrically connected to the contact part.

Depths of the first and second trenches may be decided based on sizes of opening diameters of the first and second trenches, respectively.

The opening diameter of the first trench may be greater than the opening diameter of the second trench.

The step of forming the first and second trenches may include anisotropic wet etching.

The step of forming the first and second trenches may include dry etching.

The semiconductor device may be an image sensor.

The potential fixing external terminal may be a ground terminal.

The present invention may also be directed to a manufacturing method of a semiconductor device comprising:

preparing an SOI substrate having a semiconductor layer, a semiconductor substrate layer, and a first insulation film disposed between the semiconductor layer and the semiconductor substrate layer, the semiconductor layer having a semiconductor element and an electrode pad formed thereon;

making openings in the SOI substrate from a surface of the semiconductor substrate layer to form a first trench that exposes the electrode pad and to form a second trench that terminates in the semiconductor substrate layer;

forming a second insulation film such that the insulation film covers the surface of the semiconductor substrate layer and bottoms and side walls of the first and second trenches;

removing the second insulation film from the bottoms of the first and second trenches to expose the electrode pad from the bottom of the first trench and to expose the semiconductor substrate layer from the bottom of the second trench;

forming a first wire in the first trench such that the first wire is electrically connected to the electrode pad and forming a second wire in the second trench such that the second wire is electrically connected to the semiconductor substrate layer in the second trench; and forming an external terminal electrically connected to the first wire and a potential fixing external terminal electrically connected to the second wire on the surface of the semiconductor substrate layer.

BRIEF DESCRIPTION OF THE DRAWINGS

The above and other objects, features, aspects and advantages of the present invention will be more clearly understood from the following detailed description when read and understood in conjunction with the accompanying drawings, in which.

DETAILED DESCRIPTION OF THE INVENTION

Figure 1A:
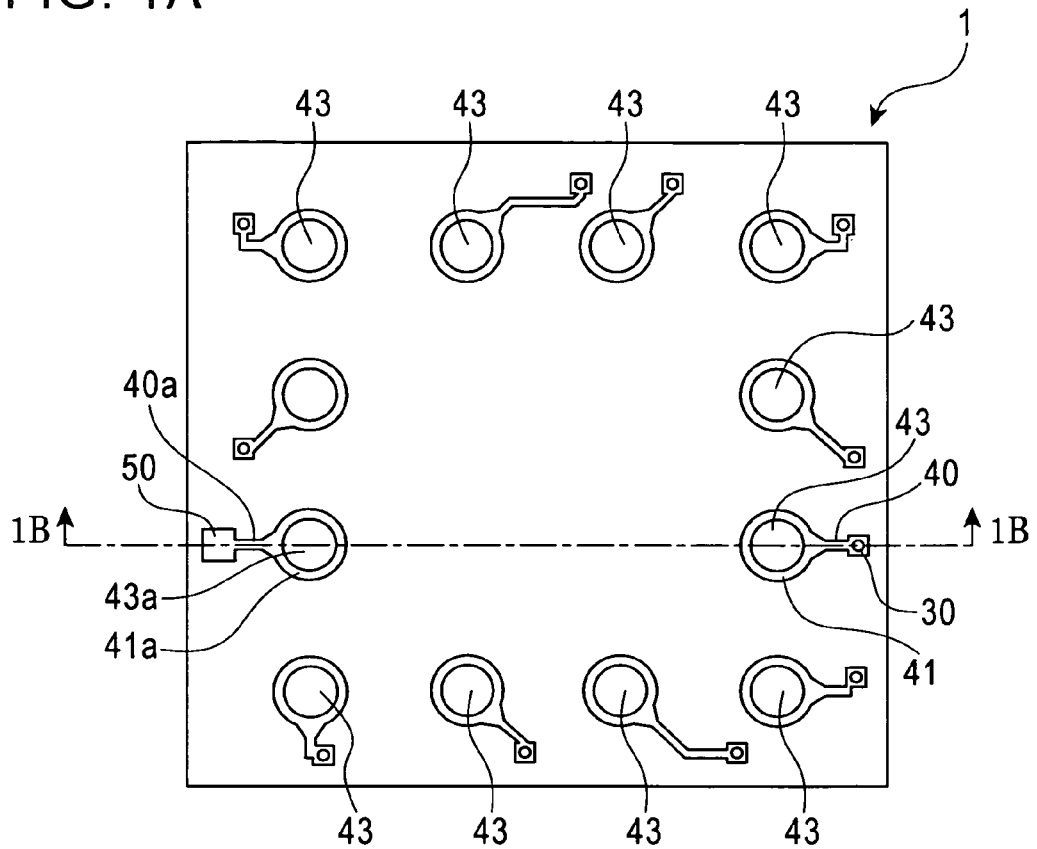
FIG. 1A is a bottom view of an image sensor according to a first embodiment of the present invention.

Now, exemplary embodiments of the present invention will be described in detail with reference to the accompanying drawings. In the drawings, substantially the same or equivalent construction elements or parts are denoted by the same reference numerals and symbols even if they are illustrated in different drawings.

First Embodiment

Figure 1B:
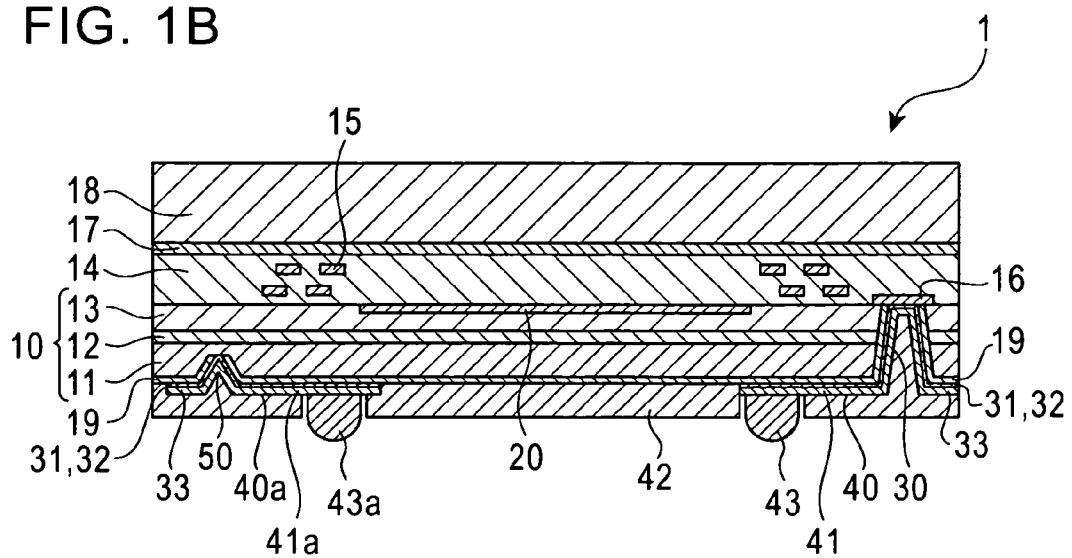
FIG. 1B is a cross-sectional view taken along the line 1B-1B in FIG. 1A.

Referring to FIGS. 1A and 1B, a wafer level chip size package (W-CSP) type image sensor 1 having through vias according to a first embodiment of the present invention will be described.

A silicon on insulator (SOI) substrate 10 is constructed in a three-layered structure including a silicon substrate layer 11, a buried oxide film layer (BOX layer) 12, and a thin film silicon layer (SOI layer) 13. A sensor circuit 20 including a charge coupled device (CCD) sensor or a complementary metal oxide semiconductor (CMOS) sensor is formed at the upper surface of the SOI layer 13. The upper surface of the SOI layer 13 serves as a light receiving surface. A plurality of imaging devices corresponding to the number of pixels are formed on the SOI layer 13. Light radiated from an object or target is focused on the light receiving surface by an optical system, such as a lens, provided outside the device. Each of the imaging devices outputs a photoelectric conversion signal corresponding to the intensity of the received light as a detection output signal. As a result, image data are created from positions and detection output signals of the respective light receiving devices.

An interlayer dielectric 14 made, for example, of $SiO_2$ is formed on the SOI substrate 10. A conductive wire 15 of a multi-layered structure connected to the sensor circuit is formed in the interlayer dielectric 14. An electrode pad 16 electrically connected to the conductive wire 15 is provided at the upper surface of the SOI layer 13. The electrode pad 16 is disposed in the vicinity of an end of the SOI substrate 10 excluding a light receiving area. A cover glass 18, serving as a light transmission support substrate, is adhered to the upper surface of the interlayer dielectric 14 by a light-transmissive adhesive 17.

In the SOI substrate 10 is provided a through via 30 extending from the silicon substrate layer 11 to the electrode pad 16 disposed at the upper surface of the SOI layer 13. The through via 30 is provided by forming a trench 34 extending from the lower surface of the SOI substrate 10 to the electrode pad 16 and sequentially forming a barrier metal film 31 made of Ti or Ti/Ni, a plating seed film 32 made of Cu, and a plating film 33 made of Cu at the side wall and bottom of the trench 34. These conductive films constituting the through via 30 are connected to the electrode pad 16 at the bottom of the trench. In addition, these conductive films are connected to a back wire 40 extending on the lower surface of the SOI substrate 10. As shown in FIG. 1A, a plurality of through vias 30 are arranged along the outer edge (periphery) of the image sensor 1. The back wire 40 is electrically connected between each of the through vias 30 and a corresponding external terminal 43. The external terminal 43 is constituted by a back electrode pad 41 formed at the end of the back wire 40 and a solder ball provided on the back electrode pad 41.

An insulation film 19 made of $SiO_2$ is provided at the side wall of the through via 30 and at the upper surface of the silicon substrate layer 11. Insulation between the through via 30 and the SOI substrate 10, between the back wire 40 and the SOI substrate 10, between the external terminal 43 and the SOI substrate 10, and between a potential fixing external terminal 43a and the SOI substrate 10 is achieved by the insulation film 19. A solder resist 42 is formed on the upper surface of the silicon substrate layer 11 such that the trench constituting the through via 30 is filled with the solder resist 42. The solder resist has an opening provided at a position where the back electrode pad 41 should be formed. A solder bump constituting the external terminal 43 is provided at the back electrode pad 41 exposed through the opening. The solder resist 42 prevents solder from being discharged to a wire portion excluding the back electrode pad 41 by solder reflow carried out when the image sensor 1 is mounted on a mounting substrate. The external terminal 43 is electrically connected to the electrode pad 16, provided on the upper face side of the SOI substrate, via the back wire and the through via 30. As a result, signal communication is achieved between the external terminal 43 and the sensor circuit 20, formed at the SOI layer 13 from the lower face side of the image sensor 1. In this way, the image sensor 1 has the through via 30, and is manufactured as a package having the same size as the SOI substrate 10.

Since the silicon substrate layer 11, located at the lowermost part of the SOI substrate 10, is insulated from the through via 30 and the back wire 40 by the insulation film 19, a contact connected to the silicon substrate layer (hereinafter, referred to as a back contact) and an external terminal (hereinafter, referred to as a potential fixing external terminal) for providing potential to the silicon substrate layer 11 via the back contact are necessary to fix the potential of the silicon substrate layer 11. Since the external terminal 43 is located on the lower face side of the image sensor 1 (i.e., on the side opposite the light receiving surface), it is preferable for the potential fixing external terminal to be provided in the same plane as the external terminal 43 if the manufacturing and package size are considered. In this embodiment, the back contact and the potential fixing external terminal connected to the back contact are provided on the lower face side of the image sensor 1 in consideration of such a package structure.

Specifically, as shown in FIG. 1B, a back contact 50 is provided by forming a trench, which does not reach the BOX layer 12, i.e., which terminates in the silicon substrate layer 11, in the SOI substrate 10 by etching, exposing the silicon substrate 11 from the bottom of the trench, and forming a conductive film electrically connected to the exposed portion of the silicon substrate 11.

The back contact 50 is drawn out on the upper surface of the silicon substrate layer 11 where the insulation film 19 is formed by a back wire 40a. A back electrode pad 41a, serving as an external electrode, is formed at the end of the back wire 40a. A solder ball is provided on the back electrode pad 41a exposed through an opening of the solder resist 42. The back electrode pad 41a and the solder ball constitute a potential fixing external terminal 43a. When desired potential is applied from the potential fixing external terminal 43a, it is possible to fix potential of the silicon substrate layer 11 via the back wire 40a and the back contact 50, thereby achieving operational stability of the sensor circuit.

If a semiconductor substrate and a metal film are connected to each other in a direct contact state, the Schottky barrier junction is formed. Generally, the Schottky barrier junction deteriorates voltage control. When a contact is formed at a semiconductor substrate, therefore, a process for implanting a high-concentration dopant into the upper surface of the semiconductor substrate is carried out to obtain an ohmic contact. In this embodiment, however, the back contact 50 is provided only to fix potential of the silicon substrate layer 11. For this reason, no voltage control is necessary, and no ohmic contact is necessary. As a result, the contact between the back contact 50 and the silicon substrate layer 11 may be the Schottky barrier junction. Consequently, it is not necessary to implant a high-concentration dopant into the portion (back contact forming portion) of the silicon substrate layer 11 where the back contact 50 is to be formed.

In the image sensor 1 of this embodiment, the back contact 50, the potential fixing external terminal 43a, and the back wire 40a, which connects the back contact 50 and the potential fixing external terminal 43a to each other, are entirely provided on the surface of the silicon substrate layer 11 (on the lower face side of the image sensor 1). Consequently, it is possible to easily form wiring from the back contact 50 to the potential fixing external terminal 43a. The potential fixing external terminal 43a is formed in the same plane as the external terminal 43 in the same structure as the external terminal 43. Consequently, it is possible to fix potential of the silicon substrate layer 11 by mounting the potential fixing external terminal 43a on a mounting substrate via the solder bump and applying voltage from the mounting substrate. Furthermore, it is not necessary to carry out wire bonding after the mounting operation, and user convenience is not deteriorated.

In this embodiment, the back contact 50 is formed at the trench formed in the silicon substrate layer 11. As will be described later, therefore, it is possible to form the back contact 50 by the same process as the through via forming process. Consequently, it is possible to simultaneously form the back contact 50 and the through via 30, and therefore, the number of manufacturing steps is not increased, and manufacturing time is not increased, due to the provision of the back contact 50.

Second Embodiment

Figure 2:
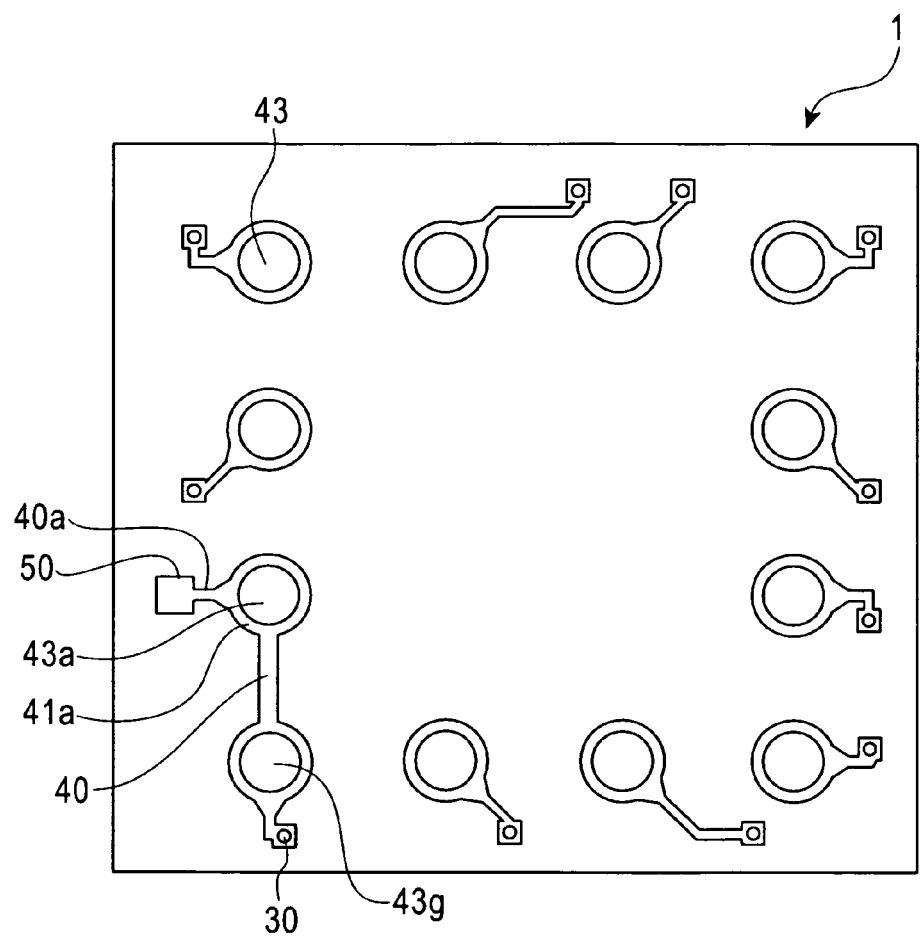
FIG. 2 is similar to FIG. 1A and shows a bottom view of an image sensor according to a second embodiment of the present invention.

In the construction shown in FIGS. 1A and 1B, it is possible to apply voltage, different from voltage applied to the external terminal 43 to the potential fixing external terminal 43a, from the voltage application side. The present invention is not limited to this construction, and FIG. 2 shows a modification to this construction. In FIG. 2, voltage applied to the external terminal 43 is used as potential fixing voltage for the silicon substrate layer 11. In a case in which ground potential (GND potential) is used to fix potential of the silicon substrate layer 11, the potential fixing external terminal 43a is connected to an existing GND terminal 43g provided as a functional terminal of the image sensor by a back wire 40. The second embodiment (FIG. 2) is particularly useful when voltage different from voltage applied to the external terminal 43 cannot be applied to the potential fixing external terminal 43a, for example, due to the circumstances of the voltage application side.

Third Embodiment

Figure 3A:
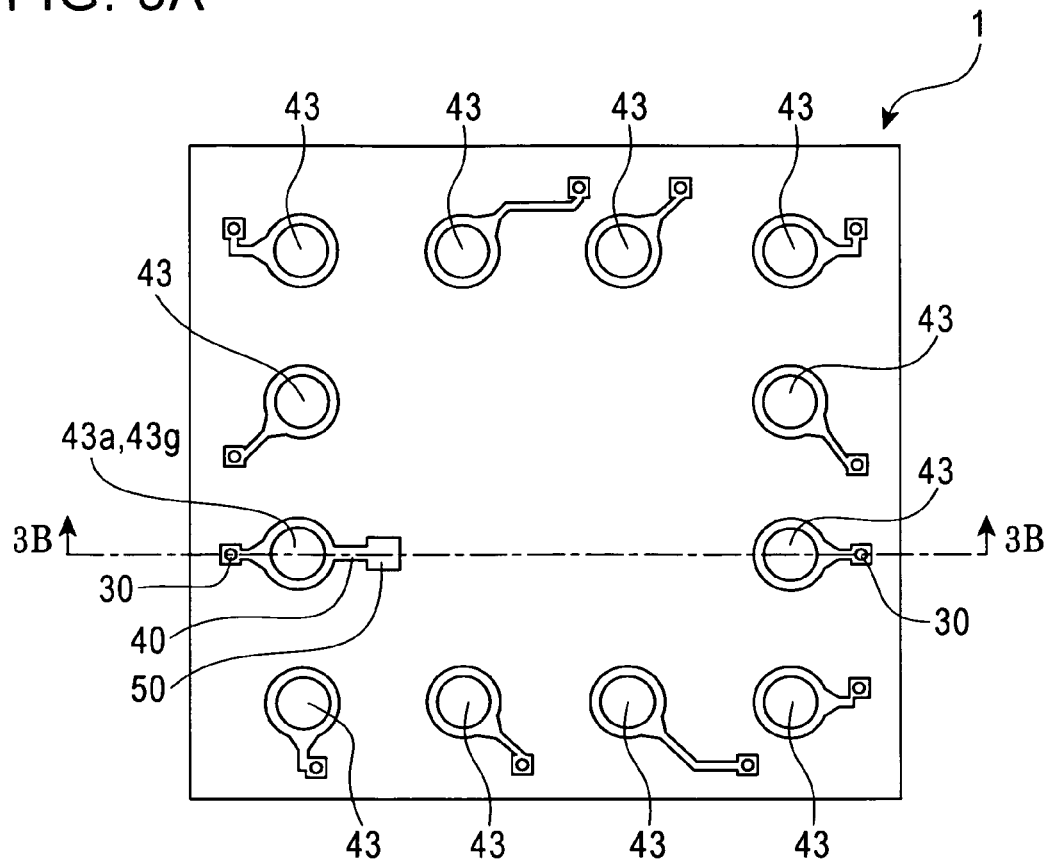
FIG. 3A is similar to FIG. 1A and shows a bottom view of an image sensor according to a third embodiment of the present invention.
Figure 3B:
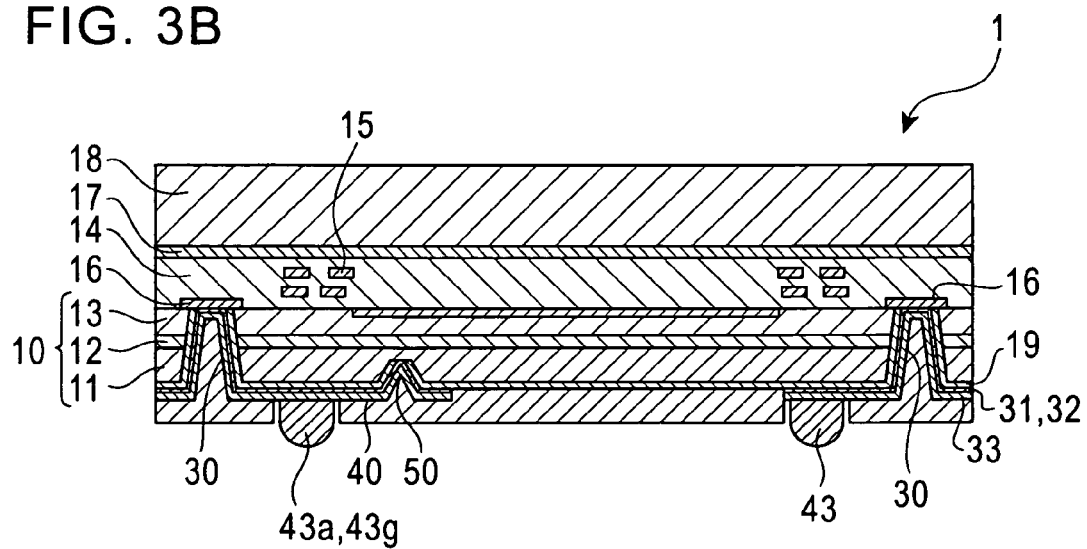
FIG. 3B is a cross-sectional view taken along the line 3B-3B in FIG. 3A.

FIGS. 3A and 3B illustrate another modification to the first embodiment. In these drawings, an existing functional terminal is used as the potential fixing external terminal 43a. FIG. 3A is a bottom view illustrating the construction of the image sensor 1, and FIG. 3B is a cross-sectional view. In a case in which ground potential (GND potential) is used to fix potential of the silicon substrate layer 11, an existing GND terminal 43g provided as a functional terminal of the image sensor 1 is used as the potential fixing external terminal 43a, and therefore, it is possible to use ground potential applied to the GND terminal 43g as potential fixing voltage for the silicon substrate layer 11. In this case, a back contact 50 is formed in the vicinity of the GND terminal 43g, and the back contact 50 is connected to the GND terminal 43g (or terminal 43a) by a back wire 40. The third embodiment (FIGS. 3A and 3B) is particularly useful when the potential fixing external terminal 43*a* cannot be provided in addition to the external terminals 43 due to spatial limitations.

Fourth Embodiment

Figure 4A:
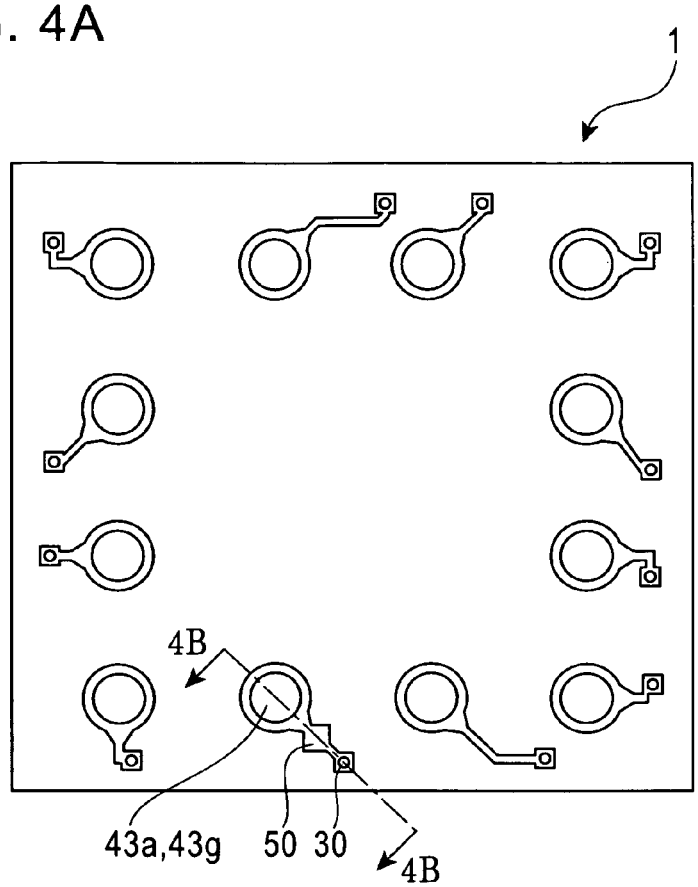
FIG. 4A is a bottom view of an image sensor according to a fourth embodiment of the present invention.
Figure 4B:
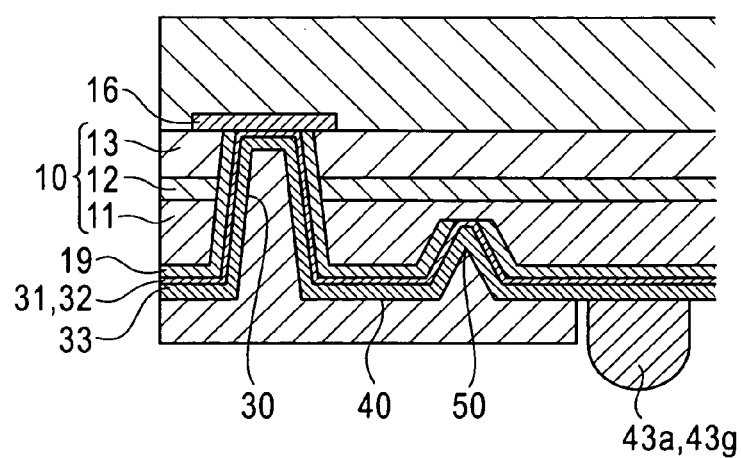
FIG. 4B is a cross-sectional view taken along the line 4B-4B in FIG. 4A.

FIGS. 4A and 4B show a modification to the third embodiment. If there is a space sufficient to form the back contact 50 in the vicinity of the GND terminal 43*g*, as shown in FIG. 3A, the provision of the back contact 50 is possible. However, the space for the back contact 50 may not be sufficient in some applications because of, for example, an increased density of the back wire 40 along with the increased number of terminals. In such case, the back contact 50 may be formed on a back wire 40 connected between a back electrode pad of the GND terminal 43*g* and a corresponding through via 30, as shown in FIGS. 4A and 4B.

Fifth Embodiment

Figure 5A:
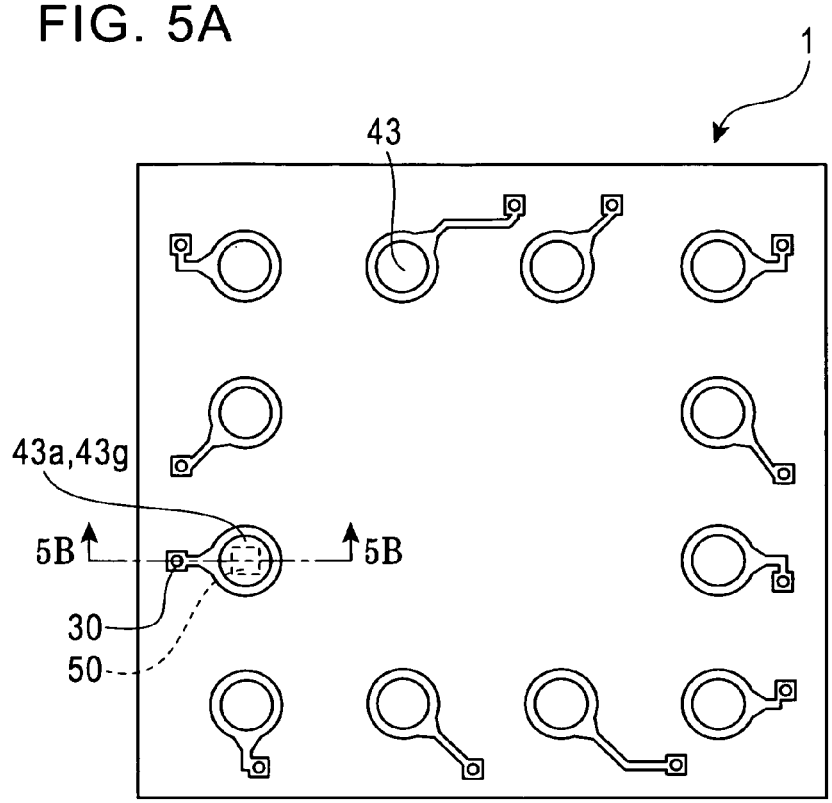
FIG. 5A is a bottom view of an image sensor according to a fifth embodiment of the present invention.
Figure 5B:
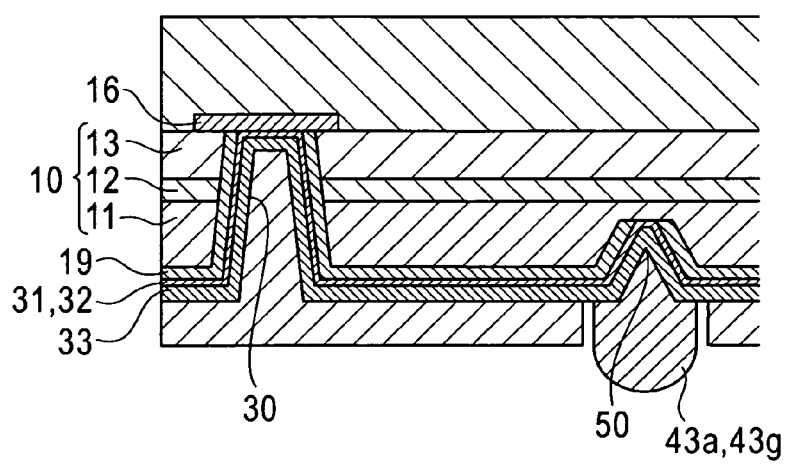
FIG. 5B is a cross-sectional view taken along the line 5B-5B in FIG. 5A.

FIGS. 5A and 5B show another modification to the third embodiment. As shown in FIGS. 5A and 5B, the back contact 50 may be formed immediately below a solder bump (back electrode pad 41) constituting the GND terminal 43*g*. The fifth embodiment is particular useful when it is difficult to provide a space sufficient to dispose the back contact 50.

Manufacturing Method

A manufacturing method of the image sensor 1 with the above-stated construction will be described with reference to FIGS. 6A to 7C. FIGS. 6A to 6D and FIGS. 7A to 7C are a series of sectional views illustrating process steps of the image sensor manufacturing method.

Figure 6A:
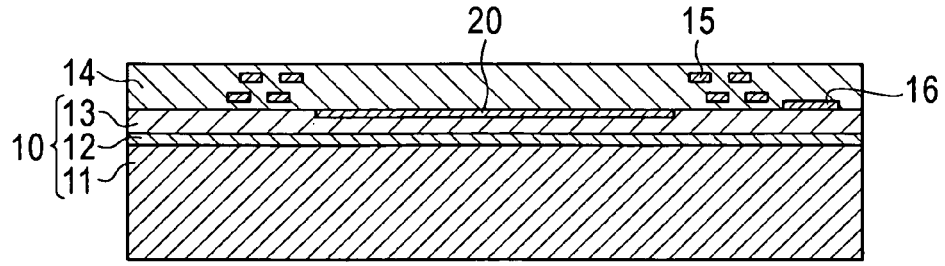
FIGS. 6A to 6D and FIGS. 7A to 7C are a series of cross-sectional views illustrating a manufacturing process of an image sensor.

First, an SOI substrate 10 constructed by stacking a silicon substrate layer 11, a BOX layer 12, and an SOI layer 13 is prepared. The SOI substrate 10 may be formed by an adhesion method or a silicon implanted oxide (SIMOX) method. In the SIMOX method, the SOI substrate 10 is formed by ion-implanting high-energy, high-concentration oxygen $O_2$ from the surface of a prime wafer, reacting the implanted oxygen with silicon through heat treatment, and forming a BOX layer 12 made of $SiO_2$ in the wafer in the vicinity of the surface of the wafer. In the adhesion method, the SOI substrate 10 is formed by bonding a wafer having a $SiO_2$ film formed at the surface thereof to another wafer using heat and pressure and removing some portions of one of the wafers in the thickness direction by grinding. Subsequently, a sensor circuit 20, such as a CMOS sensor or a CCD sensor, is formed at the SOI layer 13, and a multi-layered wire 15 and an electrode pad 16 are formed in an interlayer dielectric 14, according to a known method (FIG. 6A).

Figure 6B:
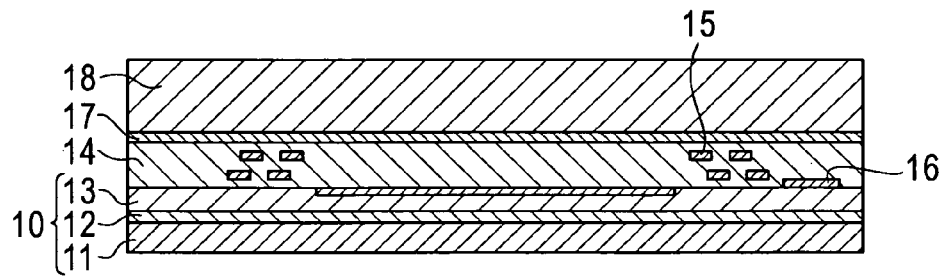

An adhesive 17 exhibiting light transmission is applied to the interlayer dielectric 14, and a cover glass exhibiting light transmission is adhered to the interlayer dielectric 14. Subsequently, the silicon substrate layer 11 is ground to adjust the thickness of the SOI substrate 10 (FIG. 6B).

Figure 6C:
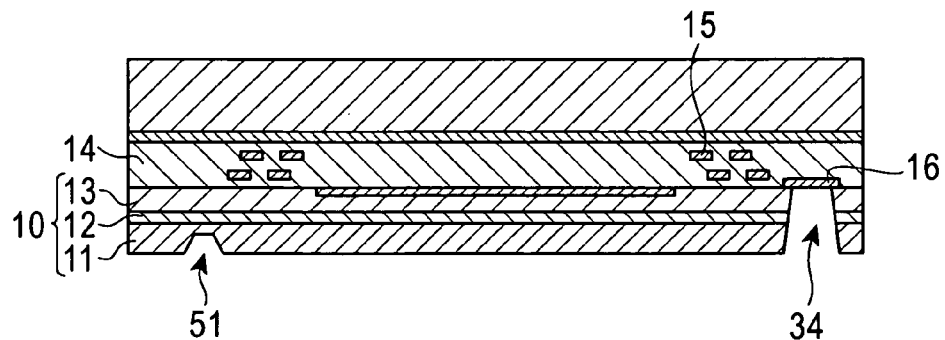

A mask (not shown) made of $SiO_2$ is formed at the surface of the silicon substrate layer 11 such that the mask has openings at positions corresponding to a region where a through via 30 is to be formed and to a region where a back contact 50 is to be formed. After that, trenches 34 and 51, having different depths, which will constitute a through via 30 and a back contact 50, respectively, are formed in the SOI substrate 10 by a wet etching method using potassium hydroxide (KOH) or tetramethyl ammonium hydroxide (TMAH) as an etchant. In the wet etching method using the above-mentioned solution, etching speed changes based on the direction of a crystal plane of the silicon substrate layer 11. That is, the wet etching method using the above-mentioned solution is anisotropic etching. In the wet etching, the etching depths of the trenches are differentiated (controlled, decided) according to the dimensions of the openings of the mask. That is, the trench (first trench) 34, constituting the through via 30 having a relatively large opening diameter, extends through the SOI substrate 10 such that the trench 34 reaches the electrode pad 16. On the other hand, the other trench (second trench) 51, constituting the back contact 50 having a relatively small opening diameter, terminates in the silicon substrate layer 11 such that the trench 51 constituting the back contact 50 is shallower than the trench 34 constituting the through via 30. In this way, the two trenches 34 and 51 having different depths are formed in the SOI substrate 10 through batch processing (i.e., the wet etching) by adjusting the dimensions of the openings of the mask. The dimensions of the openings of the mask will be described later (FIG. 6C).

Figure 6D:
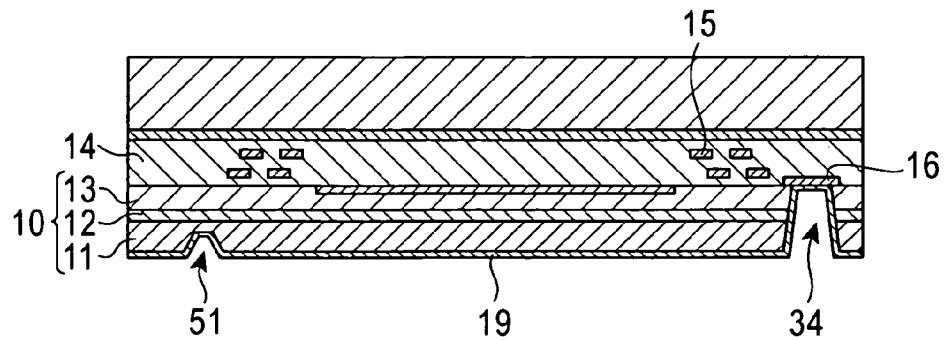

An insulation film 19 made of SiO2 is deposited over the side walls and bottoms of the trenches 34 and 51 and the surface of the silicon substrate layer 11. At this time, the film thickness of the insulation film 19 deposited on the bottoms of the trenches 34 and 51 is less than the film thickness of the insulation film 19 deposited on the surface of the silicon substrate layer 11 (FIG. 6D).

The insulation film 19 deposited on the bottoms of the trenches 34 and 51 is removed by dry etching. This dry etching uses plasma that is irradiated from the lower face side of the SOI substrate 10 to expose the electrode pad 16 from the bottom of the trench 34 and to expose the silicon substrate layer 11 from the bottom of the trench 51. Because the film thickness of the insulation film 19 deposited on the bottoms of the trenches 34 and 51 is less than the film thickness of the insulation film 19 deposited on the surface of the silicon substrate layer 11, this dry etching can remove only the insulation film 19 deposited on the bottoms of the trenches 34 and 51 by plasma irradiated from the lower surface side of the SOI substrate 10 without using a mask (FIG. A).

A barrier metal film 31 made of Ti or Ti/Ni and a plating seed film 32 made of Cu are sequentially formed at the side walls and bottoms of the trenches 34 and 51 and at the surface of the silicon substrate layer 11 (more specifically, at the insulation film 19 on the silicon substrate layer 11) by a sputtering method. Subsequently, an electrode is attached to the plating seed film 32, and a plating film 33 made of Cu is formed at the side walls and bottoms of the trenches 34 and 51 by an electroplating method. As a result, a through via 30 electrically connected to the electrode pad 16 at the bottom of the trench 34 is formed, and a back contact 50 electrically connected to the silicon substrate layer 11 at the bottom of the trench 51 is formed. Also, a conductive film constituting a back wire 40 is formed over the insulation film 19 on the silicon substrate layer 11.

Figure 7A:
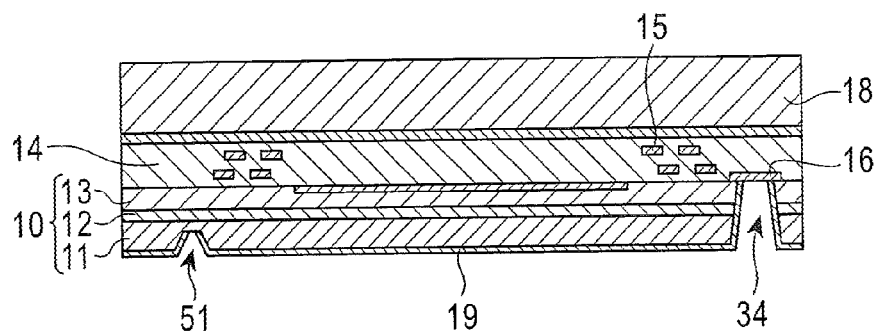
Figure 7B:
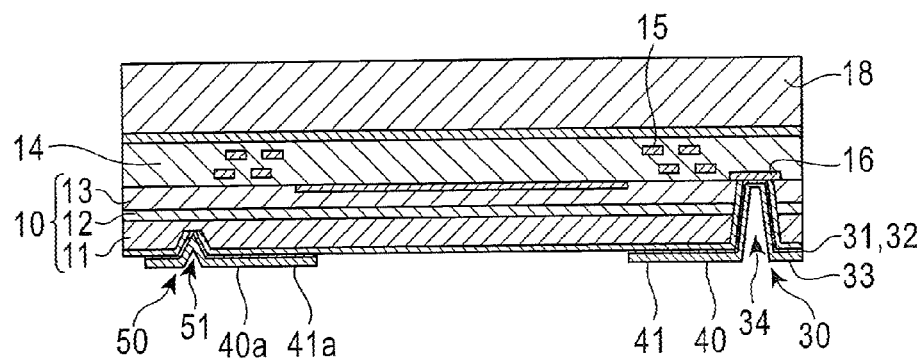

A resist mask is formed on the conductive film formed on the surface of the silicon substrate layer 11, and then the conductive film is etched with the resist mask to form back wires 40 and 40*a* and back electrode pads 41 and 41*a* having desired wiring patterns (FIG. 7B).

A solder resist 42 made of photocurable epoxy resin is applied to cover the entire surface of the silicon substrate layer 11. At this time, the interiors of the trenches 34 and 51 respectively constituting the through via 30 and the back contact 50 are filled with the solder resist 42.

Figure 7C:
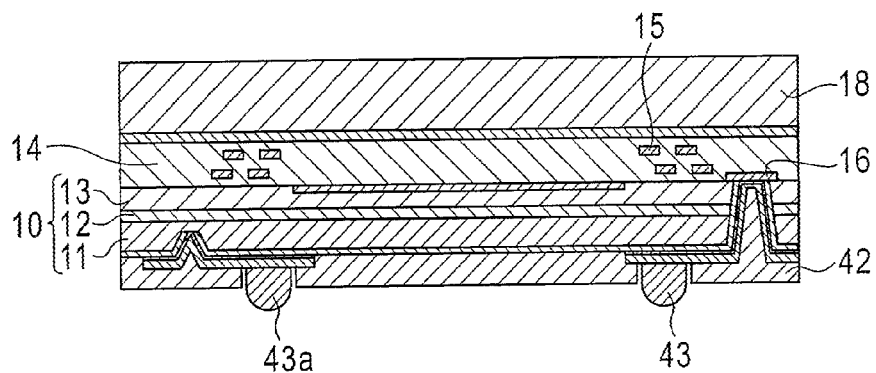

The solder resist 42 is exposed using a photo mask having a predetermined mask pattern, and the exposed portion of the solder resist 42 is photocured. Openings are formed at the positions where the back electrode pads 41 and 41*a* are to be formed by removing the unexposed portion of the solder resist 42. Subsequently, solder bumps, which will constitute external terminals 43 and a potential fixing external terminal 43a, are formed at the back electrode pads 41 and 41a exposed through the openings of the solder resist 42 by an electroplating method (FIG. 7C).

The cover glass 18 is adhered to a wafer tape, and the wafer is divided into image sensors, each having a chip shape, by dicing. Through the above-described processes, the image sensor 1 is obtained.

The process of forming the trenches 34 and 51 having different depths by wet etching during the manufacture of the image sensor 1 will be described in detail.

Figure 8:
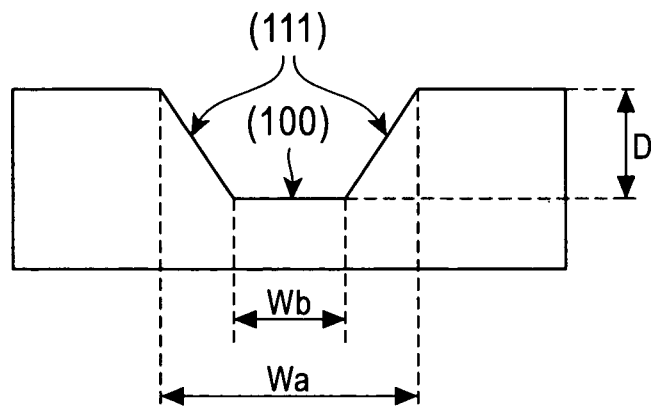
FIG. 8 is a cross-sectional view illustrating the shape of single crystalline silicon after anisotropic wet etching.

As described above, when potassium hydroxide (KOH) or tetramethyl ammonium hydroxide (TMAH) is used as an etchant in a wet etching method, etching speed changes based on the direction of a crystal plane of the silicon substrate layer 11. That is, the wet etching method is anisotropic etching. Consequently, each etched portion has a smooth plane with a very accurate angle according to the crystal plane. The silicon substrate layer 11 is a single crystalline (monocrystal) silicon substrate, and the crystal plane orientation thereof is a (100) plane. When the (100) plane of the single crystalline silicon is etched by KOH, as shown in FIG. 8, a (111) plane having an angle of 54.74 degrees appears at the side wall of a trench. Suppose that the opening diameter of a trench is Wa, the bottom diameter of the trench is Wb, and the etching depth is D, the following Equation 1 is obtained.

$$D \approx (Wa - Wb)/\sqrt{2} \quad (1)$$

Figure 9:
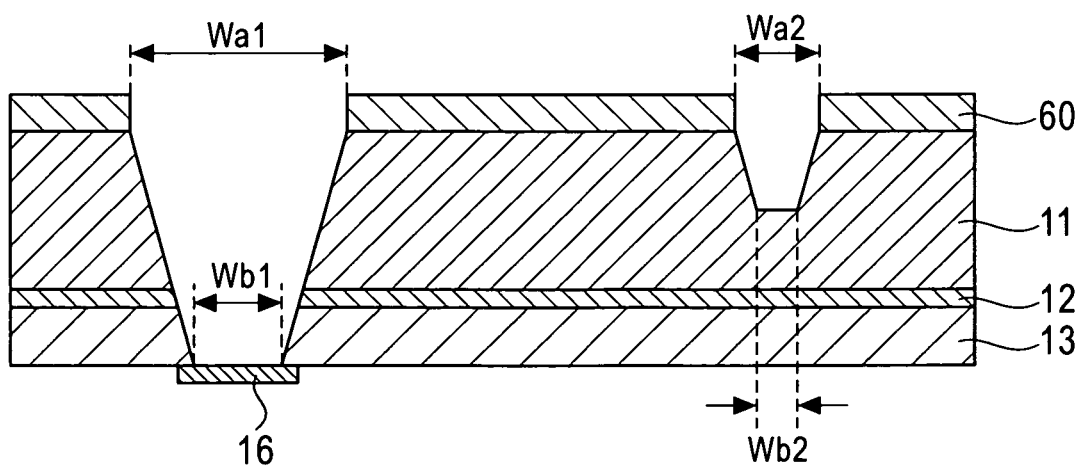
FIG. 9 is a cross-sectional view illustrating the shape of a trench that defines a through via and another trench that defines a back contact.

Equation 1 indicates that the etching depth D is decided by the opening diameter Wa of the trench. As shown in FIG. 9, therefore, it is possible to simultaneously form the two trenches 51, 34 having different depths by setting the opening diameter Wa1 of the trench 51 to be different from the opening diameter Wa1 of the trench 34. That is, it is possible to form the trench 34 at a region where the through via 30 is to be formed such that the trench 34 has a depth extending through the SOI substrate 10 and reaching the electrode pad 16, and to form the shallow(er) trench 51 at a region where the back contact 50 is to be formed such that the trench 51 terminates in the silicon substrate layer 11, by differentiating (adjusting) the dimensions Wa1 and Wa2 of the two openings of the mask 60 such that the following equality is satisfied: Wa1>Wa2.

Figure 10:
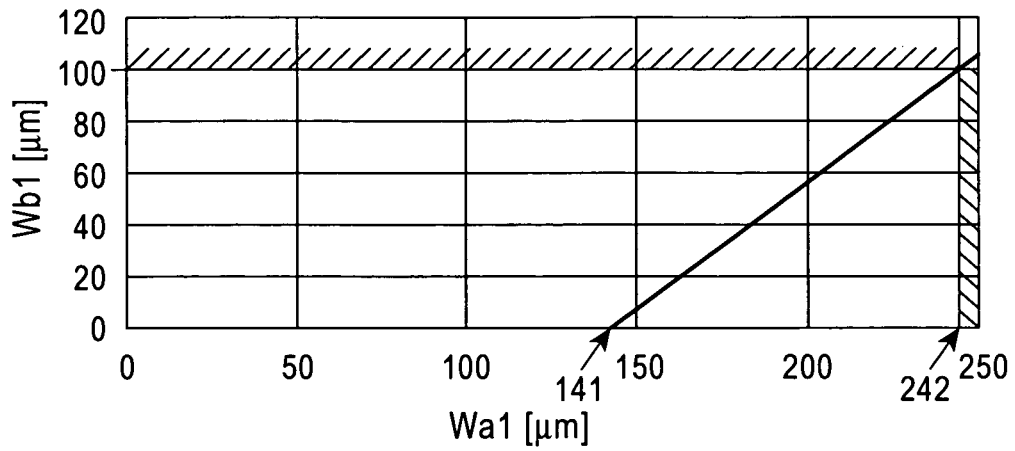
FIG. 10 is a graph illustrating a relationship between the opening diameter (top diameter) and the bottom diameter of the through via trench.

FIG. 10 is a graph illustrating a relationship between the opening diameter (top diameter) Wa1 and the bottom diameter Wb1 of the trench 34 that defines the through via 30. When the depth of the trench 34 is uniform (fixed), as shown in FIG. 10, the two diameters Wa1 and Wb1 have a linear relationship. That is, when the opening diameter Wa1 of the trench 34 is increased, the diameter Wb1 of the bottom of the trench 34 abutting the electrode pad 16 is increased proportionately. As understood from FIG. 10, it is necessary for the opening diameter Wa1 of the trench 34 to be at least 141 μm in order for the bottom of the trench 34 to reach the electrode pad 16. Also, it is necessary for the bottom diameter Wb1 of the trench 34 not to be greater than the dimension of the electrode pad 16 in consideration of influences exerted on a peripheral circuit. When the dimension of the electrode pad 16 is, for example, 100 μm×100 μm, it is necessary for the opening diameter Wa1 to be 242 μm or less.

Figure 11:
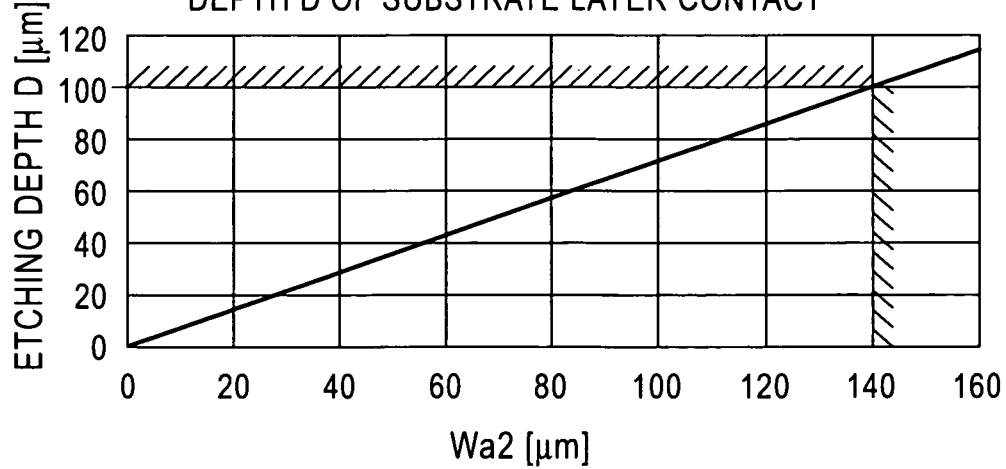
FIG. 11 is a graph illustrating a relationship between the opening diameter (top diameter) and the etching depth of the back contact.

FIG. 11 is a graph illustrating a relationship between the opening diameter Wa2 and the etching depth D of the trench 51 that defines the back contact 50. When the opening diameter Wa2 of the trench 51 is increased, as shown in FIG. 11, the etching depth D is increased proportionately. It is necessary for the trench 51 to terminate in the silicon substrate layer 11. Consequently, when the thickness of the silicon substrate layer 11 is 100 μm, it is necessary for the opening diameter Wa2 of the trench 51 to be 134 μm or less.

In the manufacturing method according to this embodiment as described above, it is possible to form the back contact 50 without adding a new process to an existing process. That is, it is possible to control the etching depth using the dimensions of the openings of the mask when the wet etching is performed, and therefore, it is possible to form trenches having different depths through batch processing using the wet etching. In other words, it is possible to simultaneously form the relatively deep trench 34, which extends through the SOI substrate 10 and reaches the electrode pad 16, and the relatively shallow trench 51, which terminates in the silicon substrate layer 11. Also, in this embodiment, the back contact 50 is formed in the trench 51, the back contact 50 has a similar structure to the through via 30, and it is possible to form the back contact 50 through the same process as the process of forming the through via 30 even after the wet etching. Consequently, it is possible to simultaneously form the back contact 50 and the through via 30, and therefore, the number of manufacturing steps is not increased, and processing time is not increased, due to the provision of the back contact 50.

The manufacturing method according to this embodiment can manufacture the respective structures shown in FIGS. 1A to 5B by only changing the etching mask and/or the pattern of the back wire 40 when etching is carried out to form the trenches 34 and 51, and therefore, it is possible to flexibly change the arrangement of the back contact 50 and the potential fixing external terminal 43a.

Figure 12:
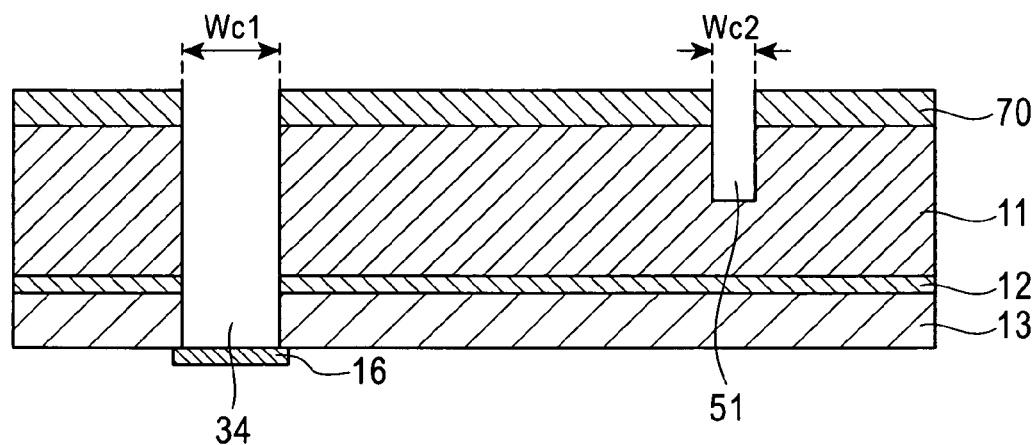
FIG. 12 is a cross-sectional view illustrating the shape of trenches constituting a through via and a back contact according to another embodiment of the present invention.

Although the trenches 34 and 51 are formed by anisotropic wet etching in the above-described manufacturing method of the image sensor 1, the trenches 34 and 51 may be formed by dry etching. The dry etching induces a micro loading effect in which an etching rate drops with the decrease of the opening areas of the etched portions or the increase of the etching depths (i.e., the increase of aspect ratios). This is because it is difficult for ions or radicals to reach the bottoms of the etched portions if the aspect ratios of the etched portions are increased. When the opening diameter Wc2 of the trench 51 and the opening diameter Wc1 of the trench 34 are set such that the opening diameter Wc2 of the trench 51 is less than the opening diameter Wc1 of the trench 34, as shown in FIG. 12, it is possible to form trenches having different depths through batch processing by such a micro loading effect. That is, it is possible to form the trench 34 at the region where the through via 30 is to be formed such that the trench 34 has a depth so as to extend through the SOI substrate 10 and reach the electrode pad 16, and to form the trench 51 at the region where the back contact 50 is to be formed such that the trench 51 terminates in the silicon substrate layer 11, by adjusting the dimensions of the openings of the etching mask 70 when the dry etching is performed.

When the opening diameter Wc2 of the trench 51 is set to, for example, 5 μm or less, it is possible to almost stop the progress of etch in the silicon substrate layer 11 having a film thickness of approximately 100 μm by such a micro loading effect. On the other hand, when the opening diameter Wc1 of the trench 34 is set to, for example, 10 μm or more, it is possible to form the trench 34 such that the trench 34 extends through the SOI substrate 10 and reaches the electrode pad 16. Also, when the dimension of the electrode pad 16 is set to, for example, 100 μm×100 μm, it is necessary for the opening diameter Wc1 to be 100 μm or less in consideration of influences exerted on a peripheral circuit. In this alternative method of making the image sensor, other processes excluding the dry etching are the same as those when the wet etching is employed.

In this way, even when the trenches 34 and 51 are formed by the dry etching, it is possible to form the back contact 50 without adding a new process to an existing process. That is, it is possible to control the etching depth by changing the dimensions of the openings of the mask when the dry etching is performed, and therefore, it is possible to form trenches having different depths through batch processing using the dry etching. Also, the back contact 50 is formed in the trench 51, the back contact 50 has a similar structure to the through via 30, and it is possible to form the back contact 50 through the same process as the process of forming the through via 30 even after the dry etching. Consequently, it is possible to simultaneously form the back contact 50 and the through via 30, and therefore, the number of manufacturing steps is not increased, and processing time is not increased, due to the provision of the back contact 50.

Figure 13:
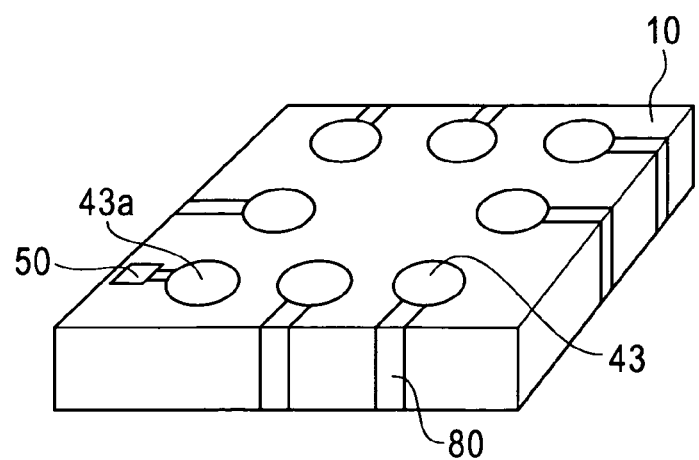
FIG. 13 is a perspective view of another image sensor (semiconductor device) according to the present invention.

Although the foregoing has described that the present invention is applied to a semiconductor device having through vias, the present invention may also be applied to a different type of semiconductor device that does not have through vias, as shown in FIG. 13. This semiconductor device has a signal transmission path formed in the thickness direction of an SOI substrate 10 by connecting electrode pads (not shown) formed at the upper surface side of the SOI substrate 10 with external terminals 43 formed at the lower surface side of the SOI substrate 10 via conductive wires 80 extending across the lateral face of the SOI substrate 10.

Figure 14:
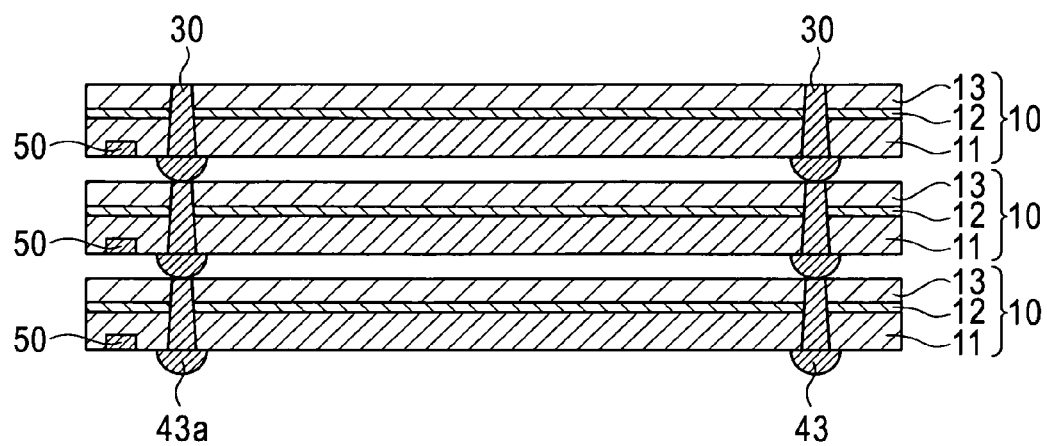
FIG. 14 is a cross-sectional view of still another image sensor (semiconductor device) according to the present invention.

Further, the present invention may be applied to a three-dimensional type package including a plurality of SOI substrates 10 stacked in the thickness direction of the SOI substrates 10, as shown in FIG. 14. Each SOI substrate 10 has through vias 30. In a package having such a structure, for example, an upper-layer SOI substrate and a lower-layer SOI substrate are electrically connected to each other via corresponding through vias to form a signal path in the thickness direction of the SOI substrates.

Back contacts may be provided at a plurality of positions, such that potential distribution of the silicon substrate layer is made uniform, based on the size of an SOI substrate used, although only one back contact is provided in the respective embodiments as described above.

This application is based on Japanese Patent Application No. 2008-284290 filed on Nov. 5, 2008 and the entire disclosure thereof is incorporated herein by reference.

What is claimed is:

1. A semiconductor device comprising:
   an SOI substrate having a semiconductor substrate layer, a semiconductor layer, and a first insulation film, said semiconductor layer having a semiconductor element and a first electrode pad formed on a surface of the semiconductor layer, and said first insulation film being disposed between the semiconductor substrate layer and the semiconductor layer, the semiconductor substrate layer having a first surface and a second surface opposite the first surface, the first surface being in contact with the first insulation film, the second surface defining an outer surface of the SOI substrate, and the surface of the semiconductor layer defining an opposite outer surface of the SOI substrate;
   a first through via extending through the SOI substrate from the second surface of the semiconductor substrate layer and terminating at the surface of the semiconductor layer, the first electrode pad being on top of one end of the first through via and being electrically connected to the first through via;
   an external terminal provided on the second surface of the semiconductor substrate layer, the external terminal being electrically connected to another end of the first through via, with a second insulation film being disposed between the external terminal and the semiconductor substrate layer;
   a contact part having a conductive film electrically connected to the semiconductor substrate layer at a bottom of a trench, said trench extending from the second surface of the semiconductor substrate layer and terminating in the semiconductor substrate layer;
   a potential fixing electrode provided on the second surface of the semiconductor substrate layer, the potential fixing electrode being electrically connected to the contact part, with the second insulation film being disposed between the potential fixing electrode and the semiconductor substrate layer;
   a second electrode pad on the surface of the semiconductor layer, said first electrode pad being separate from the second electrode pad; and
   a second through via extending through the SOI substrate from the second surface of the semiconductor substrate layer, the second through via being electrically connected to the second electrode pad, the second through via being separate from the first through via, the second through via being electrically connected to the potential fixing electrode.

2. The semiconductor device according to claim 1, wherein the potential fixing electrode is disposed between the contact part and the second through via.

3. The semiconductor device according to claim 1, wherein the contact part is disposed between the potential fixing electrode and the second through via.

4. The semiconductor device according to claim 1, wherein the potential fixing electrode is partly received in the trench of the contact part.

5. The semiconductor device according to claim 1, wherein the electrical connection between the semiconductor substrate layer and the contact part is a Schottky barrier junction.

6. The semiconductor device according to claim 1, wherein the semiconductor substrate layer is formed of single crystalline silicon, and the trench has a sidewall constituting a (111) crystal plane of the single crystalline silicon obtained by wet-etching the semiconductor substrate layer.

7. The semiconductor device according to claim 1, wherein the contact part is provided immediately above the potential fixing electrode.

8. The semiconductor device according to claim 1, wherein the semiconductor element has a light receiving element, and a light transmission support substrate is provided on the SOI substrate such that the support substrate covers the light receiving element.

9. The semiconductor device according to claim 1, wherein the semiconductor device is an image sensor.

10. The semiconductor device according to claim 1, wherein the potential fixing external terminal electrode is a ground terminal.

11. An arrangement comprising a plurality of semiconductor devices of claim 8, wherein a plurality of SOI substrates are stacked in a thickness direction thereof, the SOI substrates being electrically connected to each other by the external terminals thereof in a stacking direction of the SOI substrates.

* * * * *